United States Patent [19]

Tsuchiya et al.

[11] Patent Number: 5,266,426
[45] Date of Patent: Nov. 30, 1993

[54] PHOTOCURED RESIN RELIEF PLATE

[75] Inventors: Hiroyuki Tsuchiya; Kousi Anai, both of Fuji, Japan

[73] Assignee: Asahi Kasei Kogyo Kabushiki Kaisha, Osaka, Japan

[21] Appl. No.: 807,876

[22] PCT Filed: May 21, 1991

[86] PCT No.: PCT/JP91/00676
§ 371 Date: Jan. 21, 1992
§ 102(e) Date: Jan. 21, 1992

[87] PCT Pub. No.: WO91/18329
PCT Pub. Date: Nov. 28, 1991

[30] Foreign Application Priority Data

May 21, 1990 [JP] Japan .................. 2-129211

[51] Int. Cl.$^5$ .............. G03C 3/00; G03F 7/00
[52] U.S. Cl. .................. 430/15; 430/11; 430/18; 430/273; 430/306; 430/325; 101/395; 101/401.1
[58] Field of Search ........... 430/11, 14, 15, 18, 430/306, 325, 273; 101/401.1, 395

[56] References Cited

U.S. PATENT DOCUMENTS

| | | | |
|---|---|---|---|
| 2,993,789 | 7/1961 | Crawford | 430/306 |
| 4,115,119 | 9/1978 | Okai et al. | 101/395 |
| 4,266,007 | 5/1981 | Hughes et al. | 430/18 |

FOREIGN PATENT DOCUMENTS

| | | | |
|---|---|---|---|
| 0335399 | 10/1989 | European Pat. Off. | 430/306 |
| 54-92402 | 7/1979 | Japan . | |
| 55-6392 | 1/1980 | Japan . | |
| 62-124559 | 6/1987 | Japan . | |
| 2024441 | 1/1980 | United Kingdom . | |
| 2102977 | 5/1982 | United Kingdom . | |

OTHER PUBLICATIONS

Abstract of Japanese Patent Application Laid-Open Specification No. 62-124559; with a "Partial Translation" of said application attached thereto.

Primary Examiner—Marion E. McCamish
Assistant Examiner—Janis L. Dote
Attorney, Agent, or Firm—Birch, Stewart, Kolasch & Birch

[57] ABSTRACT

A photocured resin relief plate comprising a relief layer comprising base layer A and top layer B formed by photocuring and arranged in this order, in which the thickness of the relief layer at a highlight portion constituting a pattern having a dot percent of 7% or less is smaller than the thickness of the relief layer at a portion other than the highlight portion. The photocured resin relief plate can be obtained by imagewise light exposure of a multilayer photosensitive resin layer comprising a lower layer of a liquid photosensitive resin layer having minimum insolubilization light exposure value $Q_A$ and an upper layer of a liquid photosensitive resin layer having minimum insolubilization light exposure value $Q_B$, wherein $Q_B$ is not smaller than 23 millijoules/cm$^2$ and not smaller than 5 times $Q_A$. By the use of the photocured resin relief plate, broadening at the highlight portion is suppressed and sufficient printing pressure can be applied, so that bright, high quality prints with satisfactory gradation can be obtained.

5 Claims, 4 Drawing Sheets

PHOTOCURED RESIN RELIEF PLATE

TECHNICAL FIELD

The present invention relates to a photocured resin relief plate. More particularly, the present invention is concerned with a photocured resin relief plate having a high image reproducibility to thereby exhibit excellent printing performance, which plate is produced using a negative-type photosensitive resin in which a portion exposed to light becomes insoluble to a solvent.

BACKGROUND ART

In recent years, in place of the conventional relief printing plate of lead produced by a casting machine, a relief printing plate of a resin is produced by providing a negative-type photosensitive resin layer, then irradiating it with light through a negative film to photocure selected portions of the photosensitive resin layer while leaving the other portions uncured and subsequently removing the uncured portions with an aqueous solvent or high air pressure. The resultant photocured resin relief plate is light in weight and ensures easy handling as compared to the lead relief plate, so that its use is rapidly being disseminated in the field of printing, particularly in the printing of newspapers.

Generally, the performance of the photocured resin relief plate is greatly affected by the hardness of an employed photocured resin layer. For example, in the case of a hard photocured resin relief plate, it has a drawback in that dimness occurs in printed images having a large area, such as large letter images, solid images and halftone images, because of poor ink transferability, although it is excellent in reproducibility of fine lines and small dot images in printing, because the degree of deformation of a relief top portion by a printing pressure is small. When a high printing pressure is employed in printing, in order to avoid the problem of the poor ink transferability mentioned above, another problem arises, such as the broadening of fine lines and small dot images in printing and lowering of printing resistance due to the abrasion of a relief top portion.

On the other hand, in the case of a soft photocured resin relief plate, printed images are likely to be broadened to thereby cause production of sharp prints to be difficult, because of the inclination of a relief top portion to deform by a printing pressure, and especially when use is made of a printing machine having poor mechanical precision, an extremely high printing pressure is locally exerted, so that it is difficult to prevent non-uniform printed image broadening although it is so excellent in ink transferability that satisfactory ink transferability is ensured even on a matter to be printed which has poor surface smoothness, such as woody paper and news printing paper.

To avoid these drawbacks, in a flexographic printing it was attempted to use a printing plate having a soft elastic layer disposed under a substrate. However, desirable improvement of printing performance was not attained by this method because the prevention of image broadening in printing was less satisfactory due to the cushion effect of the elastic layer occurring only through the substrate, and because dimness tended to occur in, for example, printed solid images due to the escape of a printing pressure as a result of the attachment of the cushion layer.

In Japanese Patent Application Laid-Open Specification No. 54-92402, a photocured resin relief plate was proposed which is comprised of two different photocured resin layers having a hardness difference of from 10° to 20° in Shore hardness. In this plate, the hardness of the relief top layer was rendered greater than the hardness of the relief lower layer so that the deformation of the top portion of the relief by a printing pressure was minimized. However, the thickness of the relief layer at a highlight portion was identical with the thickness of the relief layer at a portion other than the highlight portion, so that the image broadening, especially at a highlight portion having a dot percent of 7% or less by a printing pressure, was not satisfactorily suppressed to thereby cause production of a desired printed matter to be infeasible.

Further, in Japanese Patent Application Laid-Open Specification No. 55-6392 (corresponding to U.K. Patent Application Laid-Open Specification No. 2,024,441), a photocured resin relief plate was proposed, which is comprised of two different resin layers having a modulus difference of at least 50 psi after light exposure to light, which resin layers resulted from a photosensitive resin layer corresponding to a relief lower layer and a photosensitive resin layer corresponding to a relief top layer, the former photosensitive resin layer exhibiting a photopolymerization rate of 1.5 to 200 times that of the latter photosensitive resin layer. Still further, in Japanese Patent Application Laid-Open Specification No. 62-124559, a photosensitive resin plate for relief printing was proposed, which is comprised of two photosensitive resin layers, i.e., a photosensitive resin layer corresponding to a relief lower layer and a photosensitive resin layer corresponding to a relief top layer, the minimum insolubilization light exposure value of the former layer being 5 mJ/cm$^2$ or less and up to ½ of that of the latter layer. By these proposals using two different photosensitive resin layers having such a photosensitivity difference, that a photosensitive resin layer corresponding to a relief top layer has less photosensitivity, the image size at the relief surface of the resultant printing plate can be rendered smaller than that of the negative film employed in the imagewise light exposure and printing performance can only be improved so much. However, according to these proposals, the relief thickness at a highlight portion is identical with that at a portion other than the highlight portion, so that the broadening of printed images by a printing pressure cannot be prevented and satisfactory printed matter cannot be obtained.

In the above situation, the present inventors have made extensive and intensive studies with a view toward developing a photocured resin relief plate having excellent image reproducibility and ensuring excellent printing performance. As a result, the present inventors have unexpectedly found that the thickness of the relief layer at a highlight portion having a dot percent of 7% or less can be rendered smaller than the thickness of the relief layer at a portion other than the highlight portion by exposing two different photosensitive resin layers having different photosensitive characteristics, which photosensitive characteristics satisfy a specific relationship, to light for a predetermined period of time to thereby form a relief base layer and a relief top layer, and that thereby, the broadening of printed images can be suppressed at the highlight portion. Based on this novel finding, the present invention has been completed.

DISCLOSURE OF THE INVENTION

Accordingly, it is an object of the present invention to provide a photocured resin relief plate having excellent image reproducibility and ensuring excellent printing performance, in which the thickness of the relief layer at a highlight portion is smaller than the thickness of the relief layer at a portion other than the highlight portion.

It is another object of the present invention to provide a method for producing the above-mentioned photocured resin relief plate effectively at a low cost.

The foregoing and other objects, features and advantages of the present invention will be apparent to those skilled in the art from the following description and appended claims taken in connection with the accompanying drawings.

Essentially, according to the present invention, there is provided a photocured resin relief plate comprising a substrate having a relief layer disposed thereon, the relief layer comprising base layer A and top layer B in this order from the substrate, the relief layer being formed by photocuring a multilayer photosensitive resin layer comprised of at least two different photosensitive resin layers having different photosensitive characteristics by imagewise light exposure, wherein the relief layer has at a highlight portion a thickness which is smaller than that at a portion other than the highlight portion, the highlight portion constituting a pattern having a dot percent of 7% or less.

In another aspect of the present invention, there is provided a method for producing a photocured resin relief plate, which comprises providing a photosensitive element comprising a substrate having disposed thereon a multilayer photosensitive resin layer comprising at least two different photosensitive resin layers having different photosensitive characteristics, the multilayer photosensitive resin layer is comprised of a lower layer of a liquid photosensitive resin layer having minimum insolubilization light exposure value $Q_A$ and an upper layer of a liquid photosensitive resin layer having minimum insolubilization light exposure value $Q_B$, the lower layer and the upper layer being arranged in this order from the substrate; imagewise exposing the photosensitive element on the multilayer photosensitive resin layer side to light to thereby form a photocured portion and an uncured portion; and subsequently washing-out the uncured portion with a developer to thereby form a relief layer comprising base layer A and top layer B respectively obtained from the lower layer and the upper layer, the relief layer having a highlight portion constituting a pattern having a dot percent of 7% or less and a non-highlight portion constituting a pattern having a dot percent exceeding 7%; wherein the $Q_B$ is not smaller than 23 millijoules/cm² and not smaller than 5 times $Q_A$ and the imagewise light exposure is conducted at a light exposure value which is in the range of from a minimum light exposure value required to form a least dot-percent highlight of the highlight portion constituting a pattern having a dot percent of 7% or less to 1.5 times the minimum light exposure value, thereby causing the relief layer to have at the highlight portion constituting a pattern having a dot percent of 7% or less a thickness which is smaller than that at a portion other than the highlight portion.

The photocured resin relief plate of the present invention will now be described with reference to FIG. 1. FIG. 1 is a schematic cross-sectional view of the photocured resin relief plate of the present invention, wherein 1 designates a substrate, S designates a relief layer at a highlight portion which is comprised of base layer A and top layer B, and L designates a relief layer at portions (shadow portion and middle tone portion) other than the highlight portion, which relief layer is comprised of base layer A and top layer B. The total thickness of the photocured resin relief plate of the present invention, i.e., the maximum value (thickness $T_1$ of relief L in FIG. 1) of the total thickness of base layer A and top layer B, is appropriately selected within the range of not larger than 8 mm according to the type of a printing machine and printing conditions. The lower limit of the total thickness about 0.3 mm.

It is requisite that the maximum value of the thickness (thickness of layer B of relief L in FIG. 1) of top layer B constituting the printing face of the relief layer be not larger than ½ of the maximum value (identical with the total thickness of layer A and layer B of relief L in FIG. 1) of the total thickness of base layer A and top layer B, and not larger than 1 mm. The maximum value of the thickness of top layer B is preferably in the range of from 0.03 mm to 0.5 mm. In other words, in the production of the photocured resin relief plate of the present invention, it is requisite that in a multilayer photosensitive resin layer having, disposed in the following order, a liquid photosensitive resin layer having minimum insolubilization light exposure value $Q_A$ as a lower layer and a liquid photosensitive resin layer having minimum insolubilization light exposure value $Q_B$ as an upper layer, the above-mentioned upper and lower layers have a total thickness of not larger than 8 mm and the thickness of the upper layer be not larger than ½ of the total thickness of the upper and lower layers and not larger than 1 mm, preferably in the range of from 0.03 to 0.5 mm. When the thickness of the upper layer is smaller than this range, the relief thickness (indicated by $T_2$ in FIG. 1) at a highlight portion having a dot percent of 7% or less of the obtained printing plate is less likely to be smaller than the relief thickness at a portion other than the highlight portion, or the relief thickness at a highlight portion is not likely to be satisfactorily smaller than the relief thickness at a portion other than the highlight portion, thereby making it less likely to attain a satisfactory effect. On the other hand, when the thickness of the upper layer exceeds this range, the relief thickness at a highlight portion having a dot percent of 7% or less of the obtained printing plate disadvantageously becomes too small as compared to the relief thickness at a portion other than the highlight portion, so that disadvantageously, the printing of an image carried at the highlight portion becomes difficult in a printing operation and, in somes cases, the formation of a relief at the highlight portion becomes difficult.

It is desired that the relief thickness ($T_2$) at a highlight portion having a dot percent of 7% or less of the obtained printing plate is smaller than the relief thickness ($T_1$) at a portion other than the highlight portion by 20 to 100 μ, more preferably 20 to 80 μ.

In the printing plate of the present invention, the relief thickness is the smallest at a least dot-percent highlight in a highlight portion constituting a pattern having a dot percent of 7% or less, and gradually increases toward a dot percent of 7%. In a region having a dot percent exceeding 7%, the relief thickness is identical to the relief thickness at a portion other than the highlight portion.

In the present invention, it is requisite that the minimum insolubilization light exposure value $Q_B$ (millijoules/cm$^2$) (hereinafter referred to as "mJ/cm$^2$") of a photosensitive resin layer (2B in FIG. 2) for forming a top portion of a relief layer be not smaller than 23 mJ/cm$^2$ as measured by the TO method (thickness optimization method) as described below, and that it be not smaller than 5 times the minimum insolubilization light exposure value $Q_A$ (mJ/cm$^2$) of the photosensitive resin layer (2A in FIG. 2) for forming a base portion of the relief layer. When this requirement is not satisfied, the characteristic structure of the printing plate of the present invention, i.e., a structure such that the relief thickness at a highlight portion constituting an image pattern having a dot percent of 7% or less is smaller than the relief thickness at a portion other than the highlight portion, cannot be realized.

Hereinbelow, the mechanism in which the relief thickness at a highlight portion having a dot percent of 7% or less is rendered smaller than the relief thickness at a portion other than the highlight portion when such requirements are satisfied that $Q_B$ not be smaller than 23 mJ/cm$^2$ and not be smaller than 5 times $Q_A$, will be explained referring to FIG. 2. When a photosensitive element comprising substrate 1 and, disposed thereon in the following order, photosensitive resin layer 2A and photosensitive resin layer 2B is irradiated with light (UV) through negative film 3 from the side of layer 2B to effect an imagewise light exposure, a portion of a relief corresponding to layer 2A is first formed at a highlight portion having a dot percent of 7% or less. Further, under the influence of the curing of layer 2A, layer 2B is partially cured at a portion which is in contact with layer 2A (a portion of layer 2B facing the negative film undergoes partial, slight curing as shown in FIG. 2, but layer 2B is not cured throughout the entire thickness thereof). Thus, a state shown in FIG. 2 is reached. At this point in time, the imagewise light exposure is terminated and then a development treatment is conducted, thereby obtaining a relief comprised of cured layer 2A and, having disposed thereon, a cured lower portion of layer 2B, i.e., a relief (relief S in FIG. 1) comprised of base layer A and a small top layer. The thickness of relief S is smaller than the thickness of a relief (relief L in FIG. 1) formed by completely curing layer 2B. Thus, the printing plate of the present invention is obtained.

For the above-mentioned mechanism to be realized, it is necessary that the photocuring of the upper photosensitive resin layer require light exposure value $Q_B$ to be as large as 23 mJ/cm$^2$ or more and that the photocuring of the lower photosensitive resin layer require light exposure value $Q_A$ to be as small as 1/5 $Q_B$ or less.

When $Q_B$ is less than 23 mJ/cm$^2$ or when $Q_B$ is less than 5 times $Q_A$, imagewise light exposure at a light exposure value enough to form a least dot-percent highlight in a highlight portion constituting a pattern having a dot percent of 7% or less results in a printing plate having no difference in relief thickness between the highlight portion and the other portions. Further, in the case of such a system of photosensitive resin layer, if the light exposure value is reduced, a highlight is no longer formed and a plate in which the relief thickness at a highlight portion is smaller than the relief thickness at a portion other than the highlight portion cannot be obtained. The minimum insolubilization light exposure value for a photosensitive resin as defined in the present invention can be determined by the TO method described below. A view for explaining the principle of the TO method is given in FIG. 3.

First, a photopolymerization-type photosensitive resin layer having a length of 3 cm, a width of 15 cm and a thickness of 4 mm is provided on substrate 1 transparent to light and having adhesive layer 4. Subsequently, light shielding plates 5 each having a width of 3 cm are arranged so as to leave no gap therebetween on the exposed surface of the substrate, thereby covering the exposed surface. The resultant assembly is placed on a light exposure stand provided with a light source having an intensity set such that the intensity of light after traversing the substrate having the adhesive layer be 0.40 mW/cm$^2$. Then, light (UV) is applied from the side of the substrate, and the light shielding plate at one end of the assembly (at the left end of the assembly in FIG. 3) is removed. The other light shielding plates are subsequently successively removed at intervals of 30 seconds, and the application of light is terminated 30 seconds after removing the last (the rightmost one in FIG. 3) of the five plates. As a result, a photocured resin layer is obtained in which the section corresponding to the light shielding plate first removed has been exposed to light for 150 seconds and the section corresponding to the light shielding plate last removed has been exposed to light for 30 seconds, the intermediate sections present therebetween having been exposed to light for periods of time which are successively different by 30 seconds. Subsequently, a photosensitive resin is washed-out under predetermined dissolving conditions, followed by drying and post light exposure. Then, the thickness of the photocured resin layer formed on the substrate is measured in 1/100 millimeters. The thus obtained relationship between the light exposure time and the thickness of the photocured resin plate is shown in a graph with one logarithmic axis, as in FIG. 4. An induction time (I.T., seconds) is determined from the light exposure time corresponding to a photocured resin thickness of 0 mm, and from this value, a minimum insolubilization light exposure value (mJ/cm$^2$) can be calculated. With respect to the determination of a minimum insolubilization light exposure value by the TO method, a detailed description will be provided later.

The relief layer defined in the present invention is not limited to a relief layer having a relief formed directly on a substrate (e.g., a relief layer of the structure shown in FIG. 1), but includes other relief layer, such as a relief layer formed on a photocured resin layer (background layer) provided on a substrate. The photocured resin plate of the present invention which has been described hereinabove is comprised of two layers, i.e., base layer A and top layer B. However, the photocured resin plate of the present invention may further comprise an additional layer provided under base layer A, which additional layer is formed from a photosensitive resin layer having a minimum insolubilization light exposure value which is equal to or smaller than that of the photosensitive resin layer for forming base layer A.

Further, in the production of the photocured resin relief plate of the present invention, it is preferred that the relief layer be formed from two different photosensitive resins having different characteristics, which are in a liquid form. When two different photosensitive resin layers, which are in a solid form, are provided on a substrate, not only does the required molding temperature become higher than that required in the case of liquid photosensitive resin layers, but migration of components, such as a photopolymerization initiator and a thermal polymerization inhibitor also occurs between the two different solid photosensitive resin layers during the storage between the time of shaping and the time of imagewise light exposure, thereby causing the photosensitive characteristics of the layers to suffer from unfavorable changes. Therefore, it is requisite that the photosensitive resin for use in the present invention be liquid.

There is no particular limitation with respect to the liquid photosensitive resin to be used in the present invention. Examples of liquid photosensitive resins include a liquid photosensitive resin comprising a prepolymer, such as an unsaturated polyester and an unsaturated polyurethane, an addition-polymerizable ethylenically unsaturated monomer, a photopolymerization initiator and a thermal polymerization inhibitor.

The above-mentioned unsaturated polyester can be obtained by a polycondensation reaction between an alcohol component comprising at least one polyol and an acid component comprising at least one unsaturated polybasic acid or derivative thereof (e.g., an acid anhydride, a methyl or an ethyl ester or an acid halide) and, optionally, a saturated polybasic acid added according to necessity.

Examples of unsaturated polybasic acids include maleic acid, fumaric acid, citraconic acid, mesaconic acid, itaconic acid, glutaconic acid, muconic acid and aconitic acid.

Examples of saturated polybasic acids include oxalic acid, malonic acid, succinic acid, glutaric acid, adipic acid, pimelic acid, suberic acid, azelaic acid, sebacic acid, phthalic acid, isophthalic acid, terephthalic acid and pyromellitic acid.

Examples of polyols include ethylene glycol, 1,2-propylene glycol, 1,3-propanediol, 1,4-butanediol, diethylene glycol, dipropylene glycol, polyethylene glycol (having a number average molecular weight of 150 or more), polypropylene glycol (having a number average molecular weight of 192 or more), polybutylene glycol (having a number average molecular weight of 162 or more), poly(oxyethyleneoxypropylene) glycol (having a number average molecular weight of 120 or more), glycerin, erythritol, pentaerythritol, hexitol and trimethylolpropane.

The unsaturated polyurethane can be obtained by reacting a polyol compound having in one molecule two or more terminal hydroxyl groups with a polyisocyanate having at least two isocyanate groups and then reacting the unreacted hydroxyl groups with a compound having an addition-polymerizable ethylenically unsaturated bond. As the polyol compound, those having a relatively high molecular weight are preferred, which include for example, polyetherpolyols, polyesterpolyols or polyalkylenepolyols. As the polyisocyanate, there can be used, for example, toluylene diisocyanate, xylylene di isocyanate or hexamethylene diisocyanate. In this reaction, various polyurethanes are obtained according to the molar ratio of a polyol to a polyisocyanate, order of reaction, reaction conditions, etc. The reaction is conducted in a manner such that the resultant polyurethane contains at least two terminal isocyanate groups.

Then, the polyurethane having isocyanate groups at both terminals thereof is reacted with an addition-polymeriable ethylenically unsaturated monomer having a hydroxyl group. Examples of such monomers include 2-hydroxyethyl methacrylate, 2-hydroxyethyl acrylate, 2-hydroxypropyl methacrylate, N-hydroxymethylacrylamide, polyethylene glycol monomethacrylate, allyl alchol and hydroxystyrene.

Examples of addition-polymerizable ethylenically unsaturated mnomers include acrylate acid, methacrylic acid and esters thereof [e.g., methyl (meth)acrylate, ethyl (meth)acrylate, n-propyl (meth)acrylate, isopropyl (meth)acrylate, n-hexyl (meth)acrylate, n-octyl (meth)acrylate, n-dodecyl (meth)acrylate, cyclohexyl (meth)acrylate, tetrahydrofurfuryl (meth)acrylate, allyl (meth)acrylate, glycidyl (meth)acrylate, 2-hydroxyethyl (meth)acrylate, 2-hydroxypropyl (meth)acrylate, and 3-chloro-2-hydroxy-4-hydroxybutyl (meth)acrylate; mono- or di(meth)acrylates of ethylene glycol, diethylene glycol, propylene glycol, dipropylene glycol, polyethylene glycol, polypropylene glycol and butylene glycol; trimethylolpropane triacrylate or trimethacrylate, pentaerythritol tetracrylate or tetramethacrylate; and N,N-dimethylaminoethyl methacrylate], acrylamide, methacrylamide and derivatives thereof (e.g., N-methylolacrylamide or methacrylamide, N-methoxyacrylamide or methacrylamide, N,N'-methylenebisacrylamide or methacrylamide, N,N'-hexamethylenebisacrylamide or methacrylamide, and diacetoneacrylamide or methacrylamide), styrene, vinyltoluene, divinylbenzene, diallyl phthalate, triallyl cyanurate and vinyl acetate.

Examples of photopolymerization initiators include benzoin, benzoin methyl ether, benzoin ethyl ether, benzoin n-propyl ether, benzoin isopropyl ether, benzoin n-butyl ether, benzoin isobutyl ether, benzoin-sec-butyl ether, $\alpha$-methylbenzoin, $\alpha$-ethylbenzoin, $\alpha$-methylbenzoin methyl ether, $\alpha$-phenylbenzoin, $\alpha$-allyl benzoin and 2,2-dimethoxy-2-phenylacetophenone.

Examples of thermal polymerization inhibitors include hydroquinone, p-methoxyphenol, catechol, tert-butylhydroquinone, benzoquinone, p-phenylenediamine, picric acid and phenothiazine.

In the preparation of the above-mentioned photosensitive resin, a prepolymer is mixed with an addition-polymerizable ethylenic monomer generally in proportions of from 100:20 to 100:200 by weight, and the proportions are appropriately chosen, depending on the properties of a printing plate to be obtained and the type of employed prepolymer and addition-polymerizable ethylenic monomer.

The effect of the present invention is attained by a specific printing plate structure in which the thickness of the relief layer at a highlight portion constituting a pattern having a dot percent of 7% or less is smaller than the thickness of the relief layer at a portion other than the highlight portion. In the production of a relief plate, the effect of the present invention is attained by imagewise exposing a photosensitive element comprising a multilayer photosensitive resin layer comprising two different photosensitive resin layers having different photosensitive characteristics to light at a predetermined range of light exposure value. Accordingly, the effect of the present invention is not affected by the formulation and properties of the photosensitive resin, so that the photosensitive resins which can be employed in the present invention are not limited to the examples described above.

The photosensitive characteristics of photosensitive resins can be modified by various means. For example, it can be arbitrarily modified by changing the type and quantity of a photopolymerization initiator and the type and quantity of a polymerization inhibitor, or by adding an ultraviolet light absorber.

When the amount of added photopolymerization initiator is increased, the minimum insolubilization light exposure value is decreased. On the other hand, when the amount of added photopolymerization initiator is decreased, the minimum insolubilization light exposure value is increased.

Generally, a thermal polymerization inhibitor exerts an effect of increasing the minimum insolubilization light exposure value, and this effect is increased by increasing the amount of added thermal polymerization inhibitor.

A dye, a pigment and other ultraviolet light absorbers serve to increase the minimum insolubilization light exposure value.

From the viewpoint of increasing the absolute level of photosensitivity per se, it is preferred to use a photopolymerization initiator having a high capacity for initiating photopolymerization, such as 2,2-dimethoxy-2-phenylacetophenone, and to use as an unsaturated ethylenic monomer, N, N-dimethylaminoethyl methacrylate or a diacrylate monomer having a high molecular weight.

A photopolymerization initiator is added in an amount effective for polymerization. Since a minimum insolubilization light exposure value varies according to the amount of the initiator, it is preferred that with respect to photosensitive resin layer 2B, corresponding to a relief top layer, the initiator be added in an amount of from 0.03 to 0.5% by weight relative to the resin, and be added in an amount of from 0.5 to 4.0% by weight to photosensitive resin layer 2A, corresponding to a relief base layer.

Generally, a thermal polymerization inhibitor is added in order to prevent a photosensitive resin from suffering a property change at the time of manufacture or storage thereof. Accordingly, it may be added in an amount sufficient to attain the required thermal stability, which depends on the composition, manufacturing conditions and storage conditions of a photosensitive resin. Generally, it is added in an amount of from 0.01 to 0.5% by weight relative to the resin. Further, since the thermal polymerization inhibitor functions to increase a minimum insolubilization light exposure value, it is necessary to determine the amount of inhibitor to be added, depending on the minimum insolubilization light exposure value to be obtained, and further, the necessary amount to be added varies depending on the type of thermal polymerization inhibitor employed.

For obtaining a structure in which the relief layer at a highlight portion having a dot percent of 7% or less has a thickness smaller than that at a portion other than the highlight portion, which structure is a principal feature of the present invention, it is requisite to use two different photosensitive resin layers 2A and 2B, in combination, wherein upper photosensitive resin layer 2B has minimum insolubilization light exposure value $Q_B$ which is not smaller than 23 mJ/cm$^2$ and not smaller than 5 times minimum insolubilization light exposure value $Q_A$ of lower photosensitive resin layer 2A.

If it is desired to change the hardness, after photocuring of the above-mentioned liquid photosensitive resin, this can be easily attained by known methods. For example, in the case of a liquid photosensitive resin comprising an unsaturated polyurethane, an addition-polymerizable ethylenically unsaturated monomer, a photopolymerization initiator and a thermal polymerization inhibitor, there can be employed a method comprising changing a molar ratio of a polyisocyanate compound to a polyol compound in an unsaturated polyurethane, a method comprising changing a molar ratio of an addition-polymerizable ethylenically unsaturated monomer to an unsaturated polyurethane, a method comprising changing a molar ratio of a bifunctional monomer or polyfunctional monomer to an addition-polymerizable ethylenically unsaturated monomer, and a combination thereof.

In such a case, it is preferred to choose two types of liquid photosensitive resins from the group of similar compositions, since a good adhesion is obtained between a top layer and a base layer of a relief after printing plate preparation, and because wash-removal of an unexposed resin after image formation can be conducted with a common washing liquid. However, this is not critical. The terminology "group of similar compositions" mentioned above means a group of liquid photosensitive resins containing the same type of polymers (for example, unsaturated polyester type polymers, unsaturated polyurethane type polymers, and the like).

Examples of substrates for use in the present invention include metal plates made of iron, stainless steel, copper, zinc, aluminum and the like, rubber sheets made of natural rubber, synthetic rubbers, and the like, and plastic sheets or films made of celluloid, cellulose acetate, polyethylene, polypropylene, polyvinyl chloride, polymethyl methacrylate, polystyrene, polycarbonate, polyethylene terphthalate, polyamides and the like. Generally, an adhesive layer is provided on the surface of these substrates. Further, a halation inhibitor may be incorporated in the adhesive layer, and a halation inhibiting layer may be optionally provided between the adhesive layer and the substrate.

One mode of a preferred method for producing a photocured resin relief plate of the present invention is described hereinbelow. First, on a substrate, two different layers (for example, 2A and 2B in FIG. 2) respectively comprising different liquid photosensitive resins, are successively provided so as to have predetermined thicknesses, and then, imagewise light exposure is conducted through an image-bearing transparency from the side of photosensitive resin layer 2B, followed by removal of the photosensitive resin at unexposed portions. Thus, a relief layer is formed on the substrate. In such a case, liquid photosensitive resins 2A and 2B are individually selected from among those having different photosensitive characteristics respectively satisfying the requirement described above.

A method for shaping and laminating two types of liquid photosensitive resins onto a substrate in predetermined thicknesses for light exposure can be conducted, for example, by spreading the photosensitive resin on a cover film disposed closely to a negative film by a brush, roll, doctor knife and the like in a predetermined thickness, to thereby form liquid photosensitive resin layer 2B, followed by the formation of liquid photosensitive resin layer 2A and lamination of the substrate thereon. Alternatively, the photosensitive resin can be spread on the substrate by a brush, roll, doctor knife and the like in a predetermined thickness to form liquid photosensitive resin layer 2A, followed by the formation and lamination of liquid photosensitive resin layer 2B using another liquid photosensitive resin by the similar operation.

Examples of actinic light sources for use in light exposure include a high pressure mercury lamp, a super-high pressure mercury lamp, an ultraviolet ray fluorescent lamp, a carbon arc lamp, a xenon lamp, a metal halide lamp, and the like. Theoretically, any light source which irradiates ultraviolet rays can be used. From the viewpoint of shortening light exposure time, a lamp having high light source intensity, such as a high pressure mercury lamp, a superhigh pressure mercury lamp, a metal halide lamp and the like, are preferred.

Image-forming light exposure is conducted in a manner such that a photosensitive element comprising a substrate having, closely disposed on the substrate in the following order, liquid photosensitive resin layer 2A and liquid photosensitive resin layer 2B is light-exposed on the liquid photosensitive resin layer 2B side through an image-bearing transparency using the above-mentioned light source. When the material of the substrate is substantially transparent to light, a photocured resin layer (a background layer) having a desired thickness can be formed on the substrate by irradiating the whole photosensitive element with light from the substrate side as well in addition to the imagewise light exposure from the side of photosensitive resin layer 2B, so that the height of a relief can be arbitrarily regulated. In such a case, a photocured resin layer as a background layer is included in the total thickness of the photosensitive resin layer represented by the total thickness of top layer B and base layer A of the present invention.

An light exposure through an image-bearing transparency is conducted for a period of time sufficient to form a least dot-percent highlight of a highlight portion constituting an image pattern having a dot percent of 7% or less. When an light exposure value is increased, however, the difference between a relief thickness at a highlight portion and that at a portion other than the highlight portion is likely to become nil, even at such a dot portion. Therefore, it is required that light exposure be conducted at a light exposure value which is in the range of from a minimum light exposure value required to form a least dot-percent highlight to 1.5 times the minimum light exposure value.

After the irradiation of light through an image-bearing transparency as mentioned above, wash-removal of an unexposed or uncured resin is conducted with various types of washing agents, such as water, alcohols, acetone, benzene, toluene, chloroethane, chloroethylene, aqueous alkaline solutions, e.g., aqueous solutions of sodium hydroxide, sodium carbonate, sodium phosphate, sodium tripolyphosphate, sodium borate and sodium silicate, and an aqueous surface active agent solution. Optionally, a surface active agent or the like may be added to the above-mentioned aqueous alkaline solution.

In the photocured resin relief plate of the present invention, the thickness of the relief layer at a highlight portion having a dot percent of 7% or less is smaller than that of the relief layer at a portion other than the highlight portion and, therefore, the broadening of a fine line and a fine dot in printing, which is a deficiency of relief printing, can be effectively suppressed. Especially, in halftone printing, in the conventional printing technique, dots are likely to be broadened at a highlight portion and desired printing pressure cannot be applied, so that ink transferability is poor at a shadow portion, resulting in low quality prints having poor gradation. By contrast, when a photocured resin relief plate of the present invention is used, broadening at a highlight portion can be suppressed and desirable printing pressure can be applied, so that bright, high quality prints having satisfactory gradation, can be obtained.

BEST MODE FOR CARRYING OUT THE INVENTION

Hereinbelow, the present invention will be described in more detail with reference to the following Examples, which should not be construed as limiting the scope of the present invention.

In the present invention, the measurement of photosensitive characteristics according to the TO method was conducted as described below to thereby determine a minimum insolubilization light exposure value. The following description is given referring to FIG. 3.

(1) Preparation of specimen

Liquid photosensitive resin layer 2 having a length of 3 cm, a width of 15 cm and a thickness of 4 mm, is provided on substrate 1 which is transparent to light and has adhesive layer 4 disposed thereon. Illustratively stated, a polyester film having a thickness of 9 $\mu$m is disposed in a close contact relationship on a glass plate having a thickness of 5 mm. A rubber spacer of 4 mm in thickness having a center portion which has been cut-off with the above-mentioned length, width and thickness, is placed on the polyester film. A liquid photosensitive resin is cast into the space defined by the polyester film and the spacer. A polyester substrate sheet having a thickness of 0.1 mm on which a urethane adhesive has been coated in a thickness of 10 $\mu$m is placed on the liquid photosensitive resin layer in a manner such that the adhesive layer is brought into contact with the liquid photosensitive resin layer without the presence of air being left between the polyester substrate and the liquid photosensitive resin layer to thereby obtain a photosensitive specimen disposed on the glass plate. Subsequently, a second glass plate having a thickness of 5 mm is disposed on the polyester substrate of the photosensitive specimen for storage purposes.

(2) Light source

A plurality of 2 kW superhigh pressure mercury lamps (trade name "JETLIGHT", manufactured by ORC Manufacturing Co., Ltd., Japan) or 20 W chemical lamps (trade name "FLR-20BL", manufactured by Mitsubishi Electric Corp., Japan) which are arranged in parallel so as not to cause nonuniformity in light source brightness, are used as a light source. From the viewpoint of attaining good stability for the light source, it is advantageous to use the latter lamps.

The light source (UV) is set at a position so as to emit light downward (in FIG. 3, the light source is set on the opposite position). A glass plate having a thickness of 5 mm as employed above and the above-mentioned substrate having adhesive layer 4 disposed thereon and used for providing liquid photosensitive resin layer 2 are disposed under the light source and on a UV meter (trade name "UV-MO1", manufactured by ORC Manufacturing Co., Ltd., Japan) having UV-35 filter attached thereto in such a manner that the glass plate is positioned on the light source side, and that the substrate is positioned so that adhesive layer 4 is on the lower side. The light source is then positioned at a height at which the UV meter indicates an intensity of 0.40 mW.

(3) Measurement

Five (5) light shielding, black rubber plates each having a size of 3 cm $\times$ 6 cm $\times$ 1 mm (thickness) are laterally disposed on the glass plate having the above-produced specimen provided thereunder in such a manner that the substrate is contacted with the glass plate. The light shielding plates are disposed with no gap left therebetween so as to entirely cover the specimen. Then, the specimen having, disposed thereon in the following order, the glass plate and the light shielding plates is placed at the position at which the light intensity is adjusted as mentioned above. The light shielding plate positioned at the left end as shown in FIG. 3 is removed and, simultaneously, a stopwatch is started. Then, the other light shielding plates are successively removed, one at a time at intervals of 30 seconds. 30 seconds after removing the last light shielding plate positioned at the right end as shown in FIG. 3, the light source is turned off. As a result, a photocured plate is obtained in which the section corresponding to the light shielding plate first removed, has been exposed to light for 150 seconds and the section corresponding to the light shielding plate last removed has been exposed to light for 30 seconds, the intermediate sections present therebetween having been exposed to light for periods of time which are successively different by 30 seconds.

(4) Dissolution, drying and post light exposure

Dissolution of an uncured resin layer is conducted with a liquid capable of effectively dissolving or dispersing the layer. Generally, water, an alkaline water or a surfactant solution is utilized according to necessity. Washing-out is conducted at 40° C. using a sprayer having an internal pressure of 2 kg and at a distance of 10 cm between the top of the nozzle and the specimen, so that nonuniformity is avoided in the washing-out. In this instance, washing-out is conducted on the side of the specimen opposite to the side exposed to light, (i.e., on the side of the resin), for 120 seconds. The specimen is dried in a dryer at 60° C. for 10 minutes, and then subjected to a post light exposure for 5 minutes on the side of the resin at an intensity of 2 mW using the above-mentioned light source.

(5) Determination of minimum insolubilization light exposure value

The thickness of the photocured resin layer formed on a substrate is measured using a thickness meter capable of measurement in 1/100 millimeters. The thus obtained relationship between the thickness of the photocured resin layer and the light exposure time is shown in a graph with one logarithmic axis, as in FIG. 4. An induction time (I.T., seconds) is determined from the light exposure time corresponding to a photocured resin thickness of 0 mm, and a minimum insolubilization light exposure value (mJ/cm$^2$) is calculated by the following formula.

Minimum insolubilization light exposure value Q (mJ/cm$^2$) = Light source intensity (mW/cm$^2$) × I.T.
(seconds) = 0.40 × I.T.

EXAMPLE 1 AND COMPARATIVE EXAMPLES 1 THROUGH 3

1442 parts by weight of polypropylene glycol adipate (molecular weight: 2600) and 181 parts by weight of tolylene diisocyanate were reacted at 85° C. for 2 hours. Then, 241 parts by weight of glycerin monomethacrylate and 0.1% by weight of 2,6-di-tert-butyl-p-cresol were added and further reacted for 2 hours, followed by a confirmation of the absence of NCO by infrared spectrophotometry. Subsequently, 134 parts by weight of succinic anhydride was added and further reacted for 3 hours, thereby obtaining polyurethane prepolymer (I).

Using the thus obtained polyurethane prepolymer (I), various photosensitive compositions indicated in Table 1 were produced and measured with respect to photosensitive characteristics by the TO method. The results are shown in Table 1.

TABLE 1

| | Photosensitive composition | | | | | | |
|---|---|---|---|---|---|---|---|
| | (1) | (2) | (3) | (4) | (5) | (6) | (7) |
| Component Part by Weight | | | | | | | |
| Polyurethane prepolymer (I) | 100 | 100 | 100 | 100 | 100 | 100 | 100 |
| Methoxytetraethylene glycol monomethacrylate | 25 | 25 | 25 | 25 | 15 | 15 | 15 |
| Polypropylene glycol monomethacrylate | 30 | 30 | 30 | 30 | 30 | 30 | 30 |
| Diethylene glycol dimethacrylate | 5 | 5 | 5 | 5 | 5 | 5 | 5 |
| Diethylaminoethyl methacrylate | — | — | — | — | 10 | 10 | 10 |
| 2,2-dimethoxy-2-phenylacetophenone | 0.8 | 0.64 | 0.4 | 0.16 | 3.2 | 2.56 | 1.6 |
| 2,6-di-t-butyl-p-cresol | 0.16 | 0.16 | 0.16 | 0.16 | 0.16 | 0.16 | 0.16 |
| Photosensitive Charactertistics | | | | | | | |
| I.T. (sec) | 48 | 58 | 79 | 86 | 9 | 11.5 | 14 |
| Q (mJ/cm$^2$) | 19.2 | 23.2 | 31.6 | 34.4 | 3.6 | 4.6 | 5.6 |

Using the above liquid photosensitive compositions individually, a layer for forming a relief top layer was provided in a thickness of 0.10 mm (or 0.2 mm) by means of a doctor knife on a 22 μm-thick polypropylene film disposed on a negative film having halftone and line images. Then, a layer for forming a relief base layer was likewise provided thereover in a thickness of 0.30 mm (or 0.20 mm). Further, a polyester substrate sheet having a thickness of 0.1 mm on which a urethane adhesive containing an antihalation agent had been coated in a thickness of 10 μm was placed on the layer (for forming a relief base layer) without the presence of air being left between the polyester substrate and the liquid photosensitive resin layer to obtain a photosensitive plate. The entire surface of the substrate side of the plate was irradiated with light from 20 W chemical lamps at a light exposure value which was 80% of the minimum insolubilization light exposure value of the composition for forming a relief base layer. Then, the plate was irradiated with light from the side of the negative film for 5 seconds using 6 kW metal halide lamps (intensity: 60 mW/cm$^2$).

After the light exposures, the polypropylene film was peeled off, and unexposed portions were washed-out by spraying a 1% by weight aqueous sodium borate solution at 40° C. for 2 minutes and then spraying water for 15 seconds. Then, the plate was subjected to a post light exposure in air for 10 minutes using 20 W chemical lamps (intensity: 2.3 mW/cm$^2$).

The performance of the resultant photocured resin relief plate as a relief printing plate is shown in Table 2.

As apparent from Table 2, in the case of any of combinations of compositions in which the top layer had a Q value which was not smaller than 23 mJ/cm$^2$ and not smaller than 5 times the Q value of the base layer, a printing plate was obtained in which the relief layer had at a highlight portion a thickness which was smaller than that at a solid image portion.

On the other hand, in the combination of compositions of Comparative Example 1 in which the Q value of the top layer was smaller than 23 mJ/cm$^2$, in spite of the fact that the Q value of the top layer was not smaller than 5 times the Q value of the base layer, the resultant relief layer had a thickness at a highlight portion which was the same as that at a solid image portion.

Further, in each of the combinations of compositions of Comparative Examples 2 and 3 in which the Q value of the top layer was smaller than 5 times the Q value of the base layer, in spite of the fact that the Q value of the top layer was not smaller than 23 mJ/cm², the resultant relief layer had a thickness at a highlight portion which was the same as that at a solid image portion.

Using each of the printing plates of the above Examples individually, 10,000 sheets of paper were printed on a rotary flexographic press under a printing pressure of 4 mils. As a result, bright prints having a wide range of tones were obtained with little broadening of images and with good reproduction of solid images.

TABLE 2

| | Top layer of relief | | Base layer of relief | | HL form- ing pro- perty Note 1) 85 LPI 5% | Broaden- ing of letter image Note 2) letter of 110 μm (μm) |
|---|---|---|---|---|---|---|
| | Type of compo- sition | Thick- ness (mm) | Type of compo- sition | Thick- ness (mm) | | |
| Present invention | | | | | | |
| a | (2) | 0.1 | (6) | 0.3 | ○ | Δ5 |
| b | (3) | 0.1 | (7) | 0.3 | ○ | Δ10 |
| c | (4) | 0.1 | (7) | 0.3 | ○ | Δ15 |
| d | (4) | 0.2 | (7) | 0.2 | ○ | Δ15 |
| e | (2) | 0.1 | (5) | 0.3 | ○ | Δ10 |
| Compar- ative Example | | | | | | |
| 1 | (1) | 0.1 | (5) | 0.3 | x | ▲5 |
| 2 | (2) | 0.1 | (7) | 0.3 | x | ▲5 |
| 3 | (7) | 0.1 | (7) | 0.3 | x | ▲15 |

Note 1) HL (highlight portion) forming property
○: The thickness of the relief layer at 85 LPI (lines per inch) 5% is smaller than that at a solid image portion.
x: The thickness of the relief layer at 85 LPI (lines per inch) 5% is the same as that at a solid image portion.
Note 2) Broadening of letter image (of prints) (as compared to negative film)
▲ broadened
Δ narrowed

EXAMPLE 2 AND COMPARATIVE EXAMPLE 4

Using the same photosensitive resin compositions as produced in Example 1, photosensitive elements were produced in the same manner as described in Example 1. In the photosensitive elements, relief top layer 2B had a thickness of 0.1 mm while relief base layer 2A had a thickness of 0.3 mm, and the following combinations of photosensitive resin compositions were employed with respect to top layer 2B and base layer 2A:

P₁ (Present Invention): 2B/2A=(3)/(6)
($Q_B$=31.6 mJ/cm², $Q_A$=4.6 mJ/cm²)
P₂ (Present Invention): 2B/2A=(4)/(6)
($Q_B$=34.4 mJ/cm², $Q_A$=4.6 mJ/cm²)

COMPARATIVE EXAMPLE 4: 2B/2A=(1)/(5)
($Q_B$=19.2 mJ/cm², $Q_A$=3.6 mJ/cm²)

Using these photosensitive elements individually and using a test pattern having a gradation scale as an image-bearing transparency, printing plates were produced in the same manner as described in Example 1.

Using the thus obtained printing plates individually, printing was conducted on a rotary flexographic press under a printing pressure of 4 mils.

The relationship between the dot percent of the image-bearing transparency as a negative film and the gradation scale 85 lines/inch dot percent of printed matter is shown in FIG. 5. For reference, line R is also shown therein, which represents an ideal case in which a perfect reproduction of the image of a negative film is attained in printed matter.

It is apparent that the printing plates of the present invention ensure a reproduction of image which is close to the negative film as compared to the conventional printing plate, and that the effect of improving reproducibility at a highlight portion having a dot percent of about 5% is especially remarkable in the present invention. It is also apparent that in Comparative Example 4, the gradation reproduction region of printed matter is in the range of from 23% to 100% in terms of dot percent, whereas in the present invention, the gradation reproduction region is remarkably improved to be in the range of from about 5% to 100% in terms of dot percent.

EXAMPLE 3 AND COMPARATIVE EXAMPLES 5 AND 6

1339 parts by weight of polypropylene glycol (number average molecular weight: 2,000), 175.8 parts by weight of tolylene diisocyanate and 0.042 part by weight of dibutyltin dilaurate were mixed together, and reacted at 85° C. for 2 hours. Then, 153.6 parts by weight of glycerin monomethacrylate was added, and further reacted for 2 hours, followed by a confirmation of the absence of NCO by infrared spectrophotometry. Thus, polyurethane prepolymer (II) was obtained.

Using the thus obtained polyurethane prepolymer (II), various photosensitive compositions indicated in Table 3 were produced. The photosensitive characteristics thereof were determined by the TO method. The results are shown in Table 3.

Using these photosensitive compositions individually, photocured resin relief plates were produced in the same manner as in Example 1. The performance of the thus obtained photocured resin relief plates as a relief printing plate is shown in Table 4.

Using each of the printing plates, 5,000 sheets of paper were printed on a flexographic press under a printing pressure of 4 mils. As a result, bright prints having a wide range of tones were obtained with little broadening of images and with good reproduction of solid images.

TABLE 3

| | Photosensitive composition | | | | | |
|---|---|---|---|---|---|---|
| | (8) | (9) | (10) | (11) | (12) | (13) |
| Component Part by Weight | | | | | | |
| Polyurethane prepoly- mer (II) | 100 | 100 | 100 | 100 | 100 | 100 |
| Polypropylene glycol dimethacrylate | 25 | 25 | 25 | 25 | 15 | 15 |
| trimethylolpropane trimethylacrylate | 10 | 10 | 10 | 10 | 2 | 2 |
| diethylaminoethyl methacrylate | — | — | — | — | 3 | 3 |
| hydroxyethyl methacrylate | 13 | 13 | 13 | 13 | 24 | 24 |
| 2,2-dimethoxy-2- phenylacetophenone | 0.74 | 0.59 | 0.37 | 0.15 | 3.46 | 1.73 |
| 2,6-di-t-butyl-p- cresol | 0.15 | 0.15 | 0.15 | 0.15 | 0.14 | 0.14 |
| Photosensitive Charactertistics | | | | | | |
| I.T. (sec) | 50 | 60 | 80 | 86 | 9 | 14.8 |

TABLE 3-continued

| | Photosensitive composition | | | | | |
|---|---|---|---|---|---|---|
| | (8) | (9) | (10) | (11) | (12) | (13) |
| Q (mJ/cm$^2$) | 20 | 24 | 32 | 34.4 | 3.6 | 5.9 |

TABLE 4

| | Top layer of relief | | Base layer of relief | | HL forming property Note 3) 85 LPI 5% | broadening of letter image Note 4) letter of 110 μm (μm) |
|---|---|---|---|---|---|---|
| | Type of composition | Thickness (mm) | Type of composition | Thickness (mm) | | |
| Example | | | | | | |
| a | (9) | 0.1 | (12) | 0.3 | O | ∆5 |
| b | (10) | 0.1 | (12) | 0.3 | O | ∆15 |
| c | (11) | 0.1 | (12) | 0.3 | O | ∆15 |
| d | (11) | 0.2 | (12) | 0.2 | O | ∆15 |
| Comparative Example | | | | | | |
| 5 | (8) | 0.1 | (12) | 0.3 | x | ▲5 |
| 6 | (9) | 0.1 | (13) | 0.3 | x | ▲10 | note 3) HL (highlight portion) forming property
O: The thickness of the relief layer at 85 LPI (lines per inch) 5% is smaller than that at a solid image portion.
x: The thickness of the relief layer at 85 LPI (lines per inch) 5% is the same as that at a solid image portion.
note 4) Broadening of letter image (of prints) (as compared to the negative film)
▲ broadened
∆ narrowed

EXAMPLE 4

The photosensitive compositions (2) and (6) obtained in Example 1 were employed as a relief top layer and a relief base layer, respectively, to thereby produce a photosensitive element. Then, substantially the same procedure as described in Example 1 was repeated except that metal halide lamps of 30 mW/cm$^2$ in intensity were used as a light source and the light exposure time was varied in the range of 5 to 13 seconds, thereby obtaining printing plates.

With respect to each of the thus obtained printing plates, the difference in relief layer thickness between a highlight portion of 85 LPI (lines per inch) 5% and a solid image portion present near the highlight portion was measured. The results are shown in Table 5.

TABLE 5

| | light exposure time (seconds) | "Thickness of relief layer at solid image portion" minus "thickness at highlight portion" (μm) |
|---|---|---|
| 1 | 5 | highlight portion cannot be formed. |
| 2 | 7 | 70 |
| 3 | 10 | 20 |
| 4 | 13 | 0 |

These results show that the light exposure time necessary to obtain a printing plate with a desired structure is in the range of 7 to 10 seconds, which corresponds to a light exposure value of from a minimum light exposure value required to form a least dot-percent highlight to 1.5 times the minimum light exposure value, and that an excess light exposure results in no difference in relief thickness between the highlight portion and the other portions.

BRIEF DESCRIPTION OF THE DRAWINGS

In FIGS. 1 through 5, like parts are designated by like numerals and like characters, and 1 designates a substrate, 2 a photosensitive resin layer, 2A and 2B respectively a lower layer and an upper layer of a photosensitive resin layer which respectively correspond to base layer A and top layer B of a relief, 3 a negative film, 4 an adhesive layer and 5 a light shielding plate.

INDUSTRIAL APPLICABILITY

Figure 1:
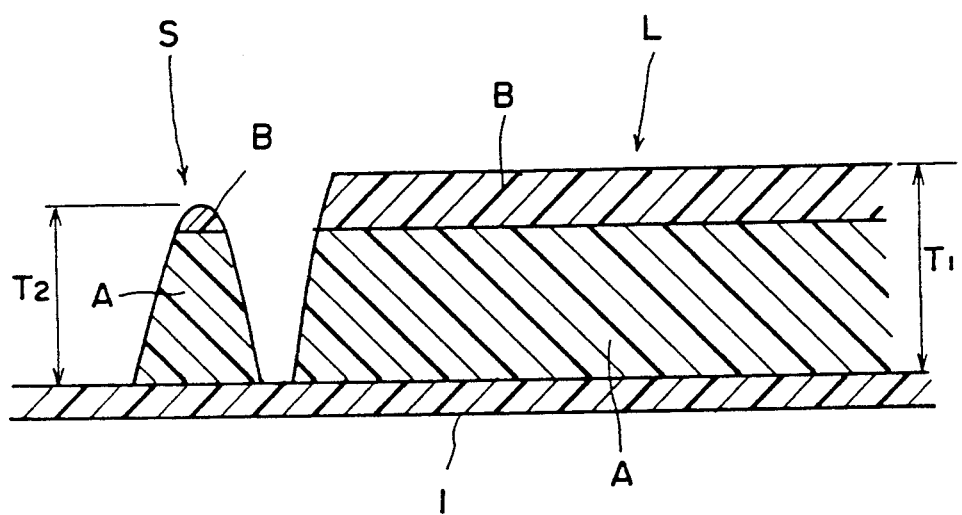
FIG. 1 is a schematic cross-sectional view of the photocured resin relief plate according to the present invention.
Figure 2:
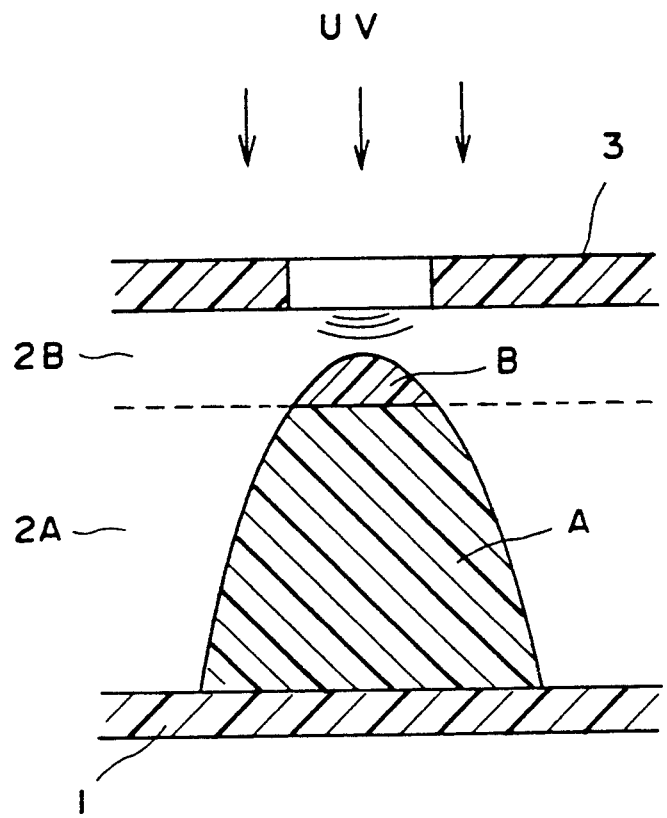
FIG. 2 is an explanatory view explaining the mechanism of formation of a relief structure in which the thickness of the relief at a highlight portion is smaller than the thickness of the relief at a portion other than the highlight portion.
Figure 3:
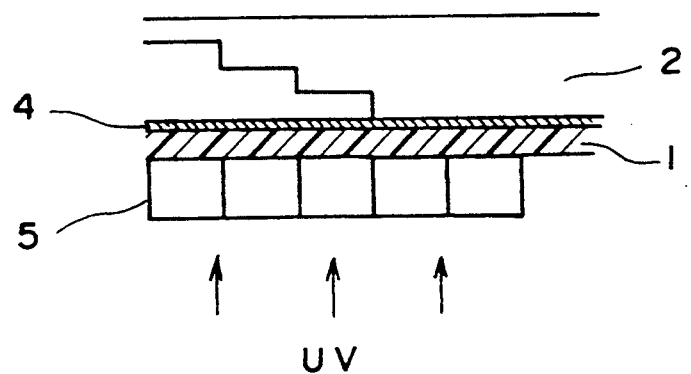
FIG. 3 is a view explaining the principle of the TO method for use in the measurement of photosensitive characteristics in order to determine the minimum insolubilization light exposure value Q of a photosensitive resin for use in the present invention.
Figure 4:
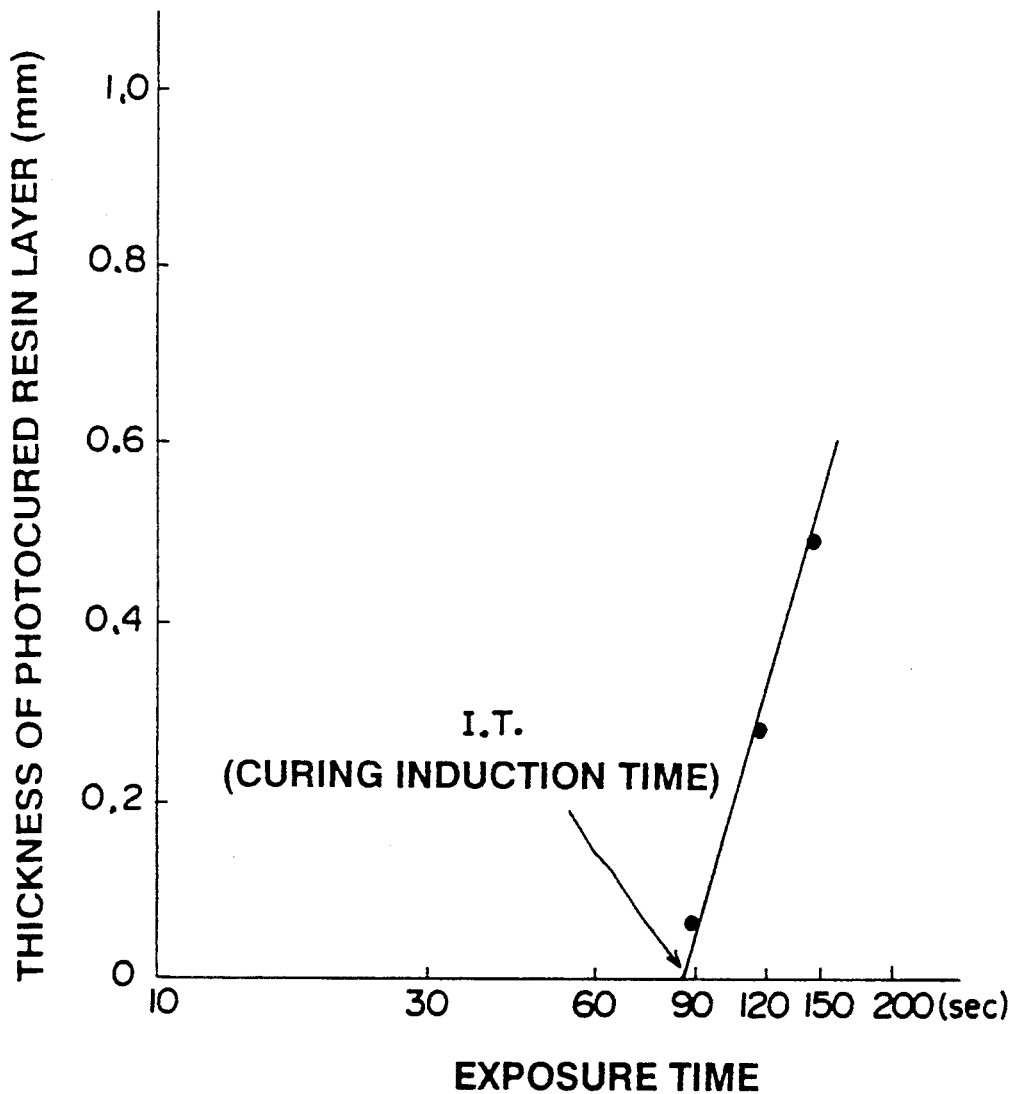
FIG. 4 is a graph having one logarithmic axis, which shows an example of relationship between light exposure time and the thickness of a photocured resin layer.
Figure 5:
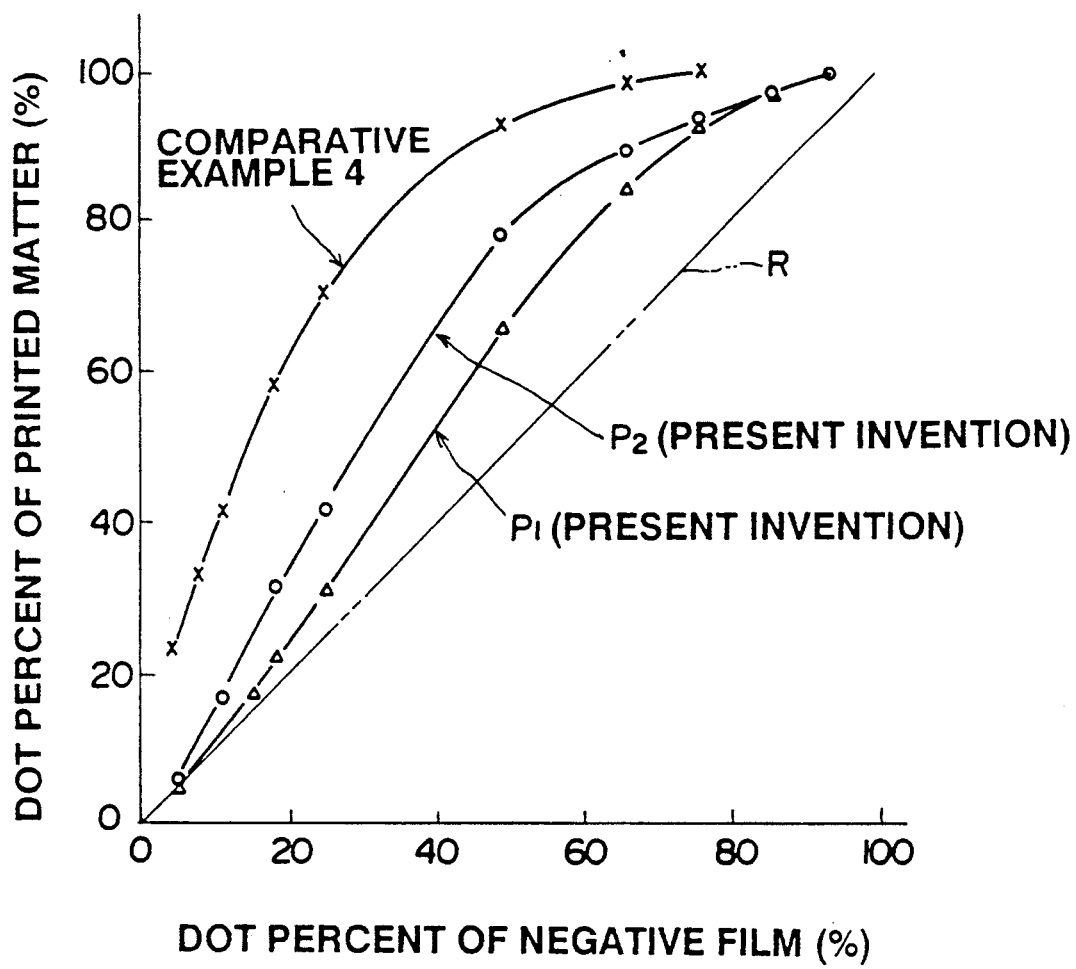
FIG. 5 shows the relationship between the dot percent of a negative film and the dot percent of a printed matter.

Broadening of fine lines and small dots in printing, which is a drawback of relief plate printing, can be effectively suppressed by the use of the photocured resin relief plate according to the present invention in which the thickness of the relief layer at a highlight portion constituting a pattern having a dot percent of 7% or less is smaller than the thickness of the relief layer at a portion other than the highlight portion. Especially, in halftone printing, image broadening at a highlight portion can be suppressed and desired printing pressure can be applied so as to obtain bright, high quality prints with satisfactory gradation by the use of the photocured resin relief plate according to the present invention, whereas according to the conventional technique, the highlight portion is likely to suffer from dot image broadening and desired printing pressure cannot be applied, so that ink transferability is poor, leading to a disadvantage that only poor quality prints with poor gradation are obtained.

We claim:

1. A photocured resin relief plate comprising a substrate having a relief layer disposed thereon, said relief layer comprising base layer A and top layer B in this order from said substrate, said relief layer being formed by photocuring a multilayer photosensitive resin layer comprised of at least two different liquid photosensitive resin layers having different photosensitive characteristics by imagewise light exposure, wherein said relief layer has at a highlight portion a thickness which is smaller than that at a portion other than the highlight portion, said highlight portion constituting a pattern having a dot percent of 7% or less.

2. The photocured resin relief plate according to claim 1, where said multilayer photosensitive resin layer comprises a lower layer of a liquid photosensitive resin layer having minimum insolubilization light exposure value $Q_A$ and an upper layer of a liquid photosensitive resin layer having minimum insolubilization light exposure value $Q_B$, said $Q_B$ being not smaller than 23 millijoules/cm$^2$ and not smaller than 5 times said $Q_A$, and wherein a maximum of the total thickness of base layer A and top layer B, which are, respectively, formed from said lower layer and said upper layer, is not larger than 8 mm as measured at a portion other than the high light portion, said top layer B having a maximum thickness which is not larger than ½ of said maximum of the total thickness of said base layer A and said top layer B and not larger than 1 mm as measured at a portion other than the high light portion.

3. A method for producing a photocured resin relief plate, which comprises providing a photosensitive element comprising a substrate having disposed thereon a multilayer photosensitive resin layer comprising at least two different photosensitive resin layers having different photosensitive characteristics, wherein said multilayer photosensitive resin layer is comprised of a lower layer of a liquid photosensitive resin layer having minimum insolubilization light exposure value $Q_A$ and an upper layer of a liquid photosensitive resin layer having minimum insolubilization light exposure value $Q_B$, said lower layer and said upper layer being arranged in this order from said substrate; imagewise exposing said photosensitive element on the multilayer photosensitive resin layer side to light to thereby form a photocured portion and an uncured portion; and subsequently washing-out said uncured portion with a developer to thereby form a relief layer comprising base layer A and top layer B respectively obtained from said lower layer and said upper layer, said relief layer having a highlight portion constituting a pattern having a dot percent of 7% or less and a non-highlight portion constituting a pattern having a dot percent exceeding 7%; wherein said $Q_B$ is not smaller than 23 millijoules/cm$^2$ and not smaller than 5 times said $Q_A$ and said imagewise light exposure is conducted at a light exposure value which is in the range of from a minimum light exposure value required to form a least dot-percent highlight of said highlight portion constituting a pattern having a dot percent of 7% or less to 1.5 times said minimum light exposure value, thereby causing said relief layer to have at said highlight portion constituting a pattern having a dot percent of 7% or less a thickness which is smaller than that at a portion other than the highlight portion.

4. The method according to claim 3, wherein the total thickness of said upper layer and said lower layer is not larger than 8 mm, said upper layer having a thickness which is not larger than ½ of said total thickness of said upper layer and said lower layer and not larger than 1 mm.

5. The method according to claim 3 or 4, wherein said imagewise light exposure is conducted using a light source selected from the group consisting of a high pressure mercury lamp, a superhigh pressure mercury lamp and a metal halide lamp.

* * * * *